United States Patent

Rastogi

(10) Patent No.: US 8,254,700 B1
(45) Date of Patent: Aug. 28, 2012

(54) OPTIMIZED METHOD AND SYSTEM FOR ENTROPY CODING

(75) Inventor: Anubha Rastogi, Noida (IN)

(73) Assignee: Adobe Systems Incorporated, San Jose, CA (US)

( * ) Notice: Subject to any disclaimer, the term of this patent is extended or adjusted under 35 U.S.C. 154(b) by 978 days.

(21) Appl. No.: 11/543,586

(22) Filed: Oct. 3, 2006

(51) Int. Cl.
- G06K 9/36 (2006.01)
- H03M 7/00 (2006.01)
- H03M 7/40 (2006.01)
- H04N 1/42 (2006.01)

(52) U.S. Cl. ........ 382/232; 382/238; 382/239; 382/245; 382/246; 341/50; 341/51; 341/65; 341/67; 341/107; 358/426.01

(58) Field of Classification Search .......... 382/232, 382/238–239, 245–246; 341/50–51, 65, 341/67, 107; 358/426.01–426.16
See application file for complete search history.

(56) References Cited

U.S. PATENT DOCUMENTS

| | | | | |
|---|---|---|---|---|
| 5,184,229 A * | 2/1993 | Saito et al. | | 382/239 |
| 5,751,232 A * | 5/1998 | Inoue et al. | | 341/63 |
| 6,081,211 A * | 6/2000 | de Queiroz et al. | | 341/65 |
| 6,311,258 B1 | 10/2001 | Gibson et al. | | |
| 6,351,760 B1 * | 2/2002 | Shankar et al. | | 708/654 |
| 6,664,902 B2 * | 12/2003 | Andrew et al. | | 341/50 |
| 6,760,478 B1 | 7/2004 | Adiletta et al. | | |
| 6,947,874 B2 * | 9/2005 | Chen | | 702/189 |
| 7,016,547 B1 | 3/2006 | Smirnov | | |
| 7,242,328 B1 * | 7/2007 | Chen et al. | | 341/67 |
| 2003/0133619 A1 | 7/2003 | Wong et al. | | |
| 2003/0202603 A1 * | 10/2003 | Chen et al. | | 375/240.25 |
| 2004/0096115 A1 | 5/2004 | Braica | | |
| 2004/0131224 A1 * | 7/2004 | Tanaka | | 382/100 |
| 2005/0036548 A1 | 2/2005 | He et al. | | |
| 2006/0117078 A1 | 6/2006 | Hou et al. | | |

FOREIGN PATENT DOCUMENTS

| | | |
|---|---|---|
| JP | 07038447 | 2/1995 |
| JP | 09036748 | 2/1997 |
| JP | 2000125295 | 4/2000 |
| WO | WO 03/034597 A1 | 4/2003 |

* cited by examiner

*Primary Examiner* — Jingge Wu
*Assistant Examiner* — Avinash J Yentrapati
(74) *Attorney, Agent, or Firm* — Schwegman, Lundberg & Woessner, P.A.

(57) ABSTRACT

An optimized method and system for entropy coding is described. The system may include an input module to receive a digital image, a Discrete Cosine Transform (DCT) module to obtain a plurality of DCT coefficients associated with the digital image, a statistics generator to generate statistics associated with the plurality of DCT coefficients, a placement module to store the generated statistics in the plurality of DCT coefficients and entropy coder to generate uniquely decodable (UD) codes for the plurality of DCT coefficients. The entropy coder may utilize the statistics stored in the plurality of DCT coefficients.

22 Claims, 7 Drawing Sheets

OPTIMIZED METHOD AND SYSTEM FOR ENTROPY CODING

TECHNICAL FIELD

This application relates to image compression and, in particular, to an optimized method and system for entropy coding.

BACKGROUND

Digital images are commonly used in several applications such as, for example, in digital still cameras (DSC), printers, scanners, etc. A digital image includes a matrix of elements, commonly referred to as a bit map. Each element of the matrix, which represents an elemental area of the image (a pixel or pel), is formed by several digital values indicating corresponding components of the pixel. Digital images are typically subjected to a compression process to increase the number of digital images which can be stored simultaneously, such as onto a memory of a digital camera. This may allow transmission of digital images to be easier and less time consuming. A compression method commonly used in standard applications is the JPEG (Joint Photographic Experts Group) algorithm, described in CCITT T.81, 1992.

In a basic JPEG algorithm, 8×8 pixel blocks are extracted from the digital image. Discrete Cosine Transform (DCT) coefficients are then calculated for the components of each block. The DCT coefficients are rounded off using corresponding quantization tables. The quantized DCT coefficients are encoded utilizing entropy coding to obtain a compressed digital image. Entropy coding may be performed by using Arithmetic encoding or by using Huffman Coding. The original digital image can be extracted later from the compressed version of the image by a decompression process.

In the process of entropy coding and the associated steps, some operations, e.g., the computation required for finding the bit-length of a DCT coefficient, may be computationally expensive. Furthermore, the check to determine whether a DCT coefficient is zero may also be expensive. This problem may be addressed by utilizing additional memory to store these values for later use. However, this approach may result in storing data that is larger than the input image that is being coded. Thus, existing encoding techniques may require additional memory usage in order to improve performance.

BRIEF DESCRIPTION OF DRAWINGS

Embodiments are illustrated by way of example and not limitation in the figures of the accompanying drawings, in which like references indicate similar elements and in which.

DETAILED DESCRIPTION

In order to perform entropy coding, an encoder (e.g., JPEG encoder) may be configured to build a probability table based on the image statistics. The image statistics may be collected for the whole image or, where an image is first divided into smaller portions, for each portion of the image. Each portion may be encoded independently. In one example embodiment, a portion of the image may be, for example, one image block of 8×8 pixels or a subset of the set of all 8×8 blocks of the image. A subset of the set of all 8×8 blocks of the image may be referred to as a sub-image. For the purposes of this description, references to an image will be understood to encompass embodiments where the image is a subimage.

A method and system are provided to improve performance during a process of entropy coding. In one example embodiment, the image statistics for Discrete Cosine Transform (DCT) coefficients (or merely coefficients) associated with a digital image may be stored intelligently in the available bits of the DCT coefficients themselves and then accessed and utilized during an operation of entropy coding.

In one example embodiment, the bit-length of a non-zero DCT coefficient may be stored in some of the bits of that coefficient. The length of a zero-run may be stored in the first zero coefficient of the run. A zero-run is a set of consecutive DCT coefficients listed in a zigzag order that have a zero value. If the last DCT coefficient is zero, the position of the last non-zero coefficient may be stored in the last DCT coefficient. An example system to improve performance during a process of entropy coding may be implemented, in one embodiment, in the context of an architecture illustrated in FIG. 1.

Figure 1:
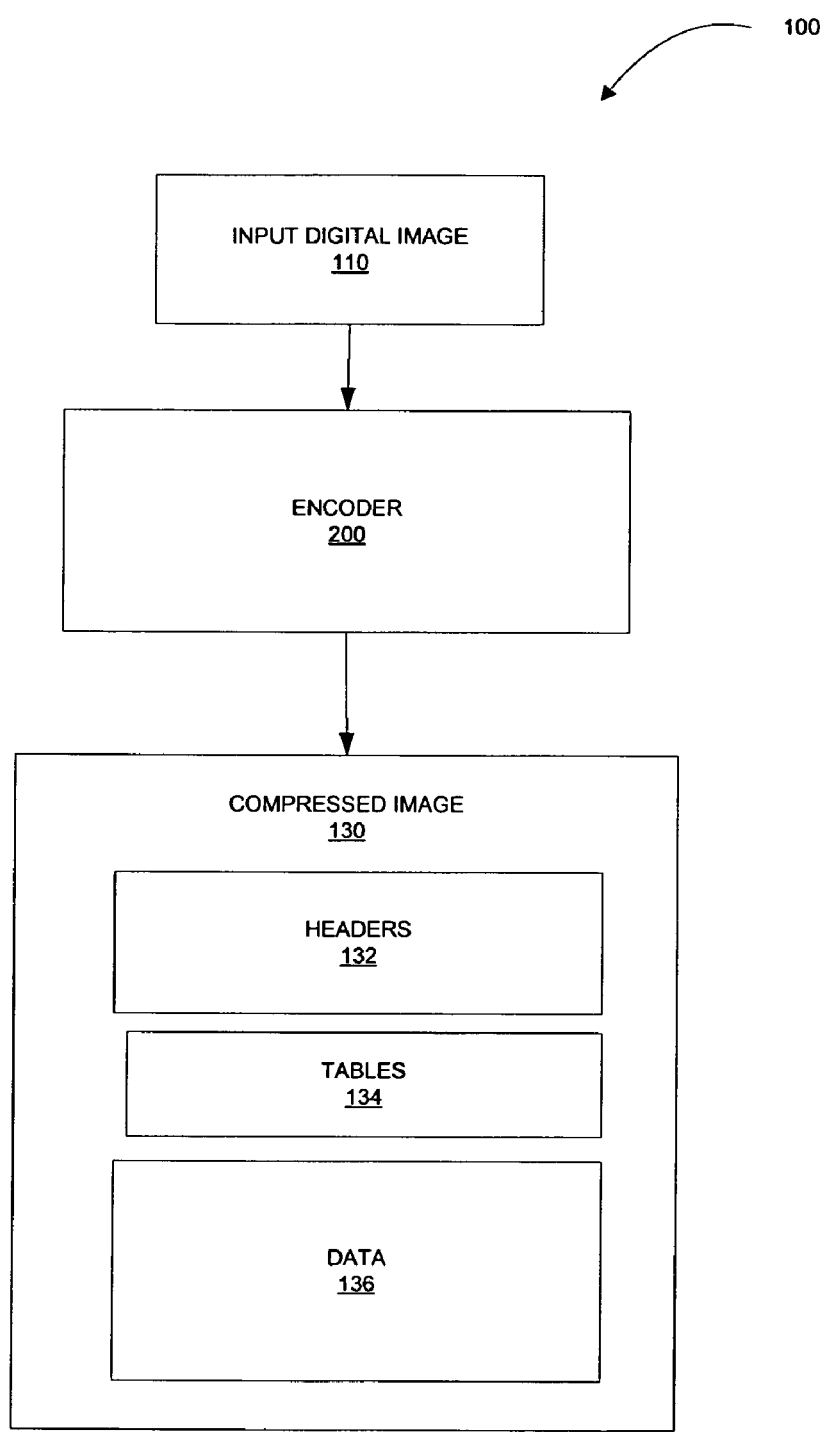
FIG. 1 illustrates an example architecture, within which the system to improve performance during a process of entropy coding may be implemented, in accordance with an example embodiment.

FIG. 1 illustrates an example architecture 100, within which the system to improve performance during a process of entropy coding may be implemented. In the example architecture 100, an input digital image 110 is provided to an encoder 200. The encoder 200 may be configured to generate a compressed image 130, e.g., a JPEG file, that corresponds to the input digital image 110. The compressed image 130 may include headers 132, tables 134, and data 136.

The architecture 100, in one example embodiment, may include a decoder to recreate the original input digital image 110 from the compressed image 130.

The input digital image 110, in one example embodiment, may be a raw digital image or a compressed digital image. If the input digital image 110 is a compressed digital image, the encoder 200 may uncompress the compressed digital image to the DCT level and perform operations to generate an improved compressed image (e.g., a compressed image that is smaller in size than the original compressed digital image). One example embodiment of the encoder 200 may be described with reference to FIG. 2.

Figure 2:
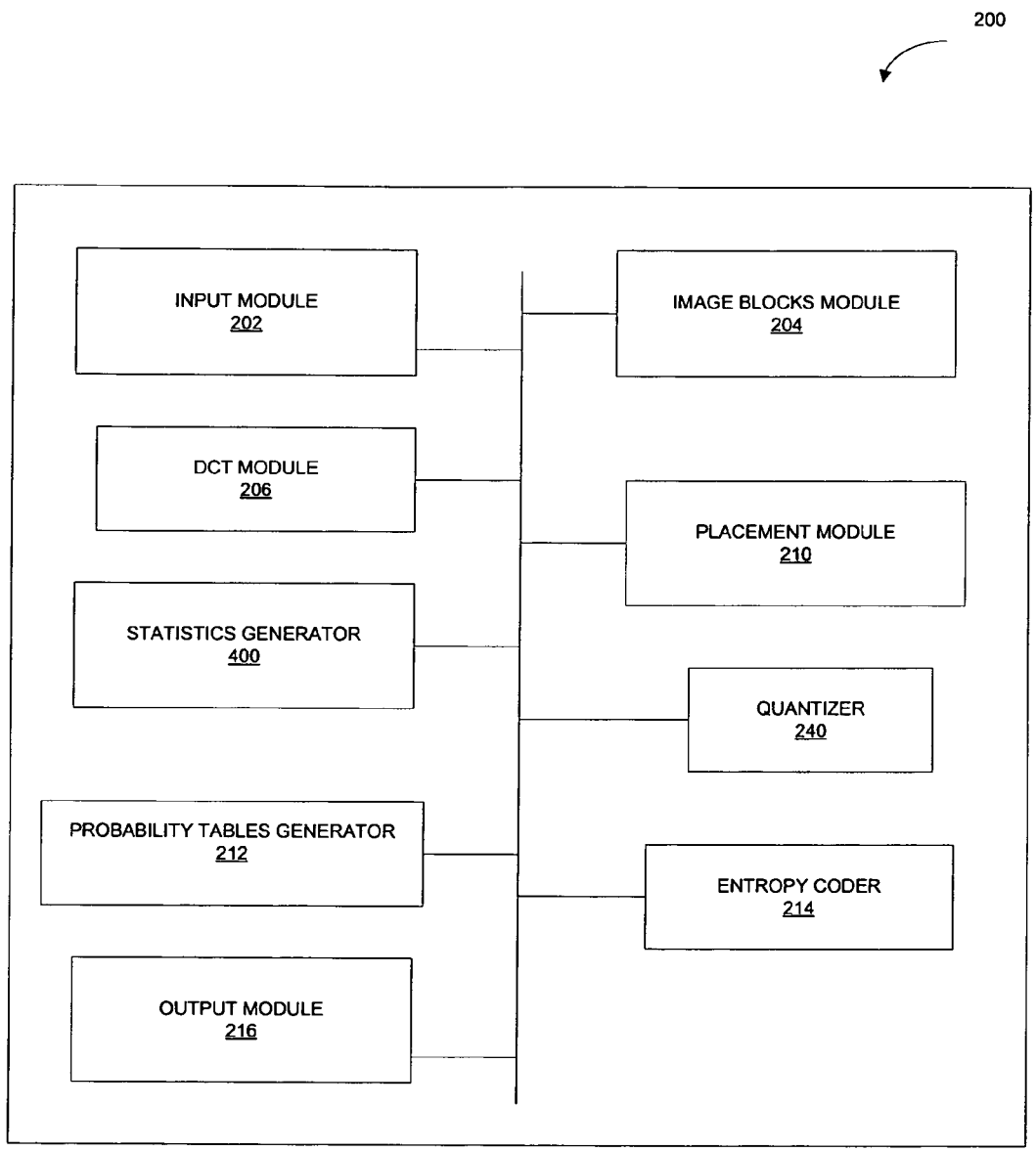
FIG. 2 is a block diagram of an encoder, in accordance with an example embodiment.

FIG. 2 is a block diagram of an encoder 200, according to one example embodiment. The encoder 200 may comprise an input module 202, a DCT module 206, a quantizer 240, an entropy coder 214 and an output module 216.

The encoder 200 may receive image pixels, or input digital image, at an input module 202. The input module 202 may provide the input digital image data to the DCT module 206. The DCT module 206 may cooperate with an image blocks module 204 to divide the input digital image into non-overlapping, fixed length image blocks. The DCT module 206 may then transform each image block into a corresponding block of DCT coefficients. The DCT coefficients may be referred to as frequency domain coefficients, and a block of DCT coefficients may be referred to as a frequency domain image block (or a frequency domain image).

The quantizer 240 may be configured to receive the DCT coefficients generated by the DCT module 206 and to quantize the corresponding set of values utilizing quantization tables. Quantization tables may provide factors indicating how much of the image quality can be reduced for a given DCT coefficient before the image deterioration is perceptible.

In an example embodiment, the entropy coder 214 is configured to receive the quantized DCT coefficients from the quantizer 240 and to rearrange the DCT coefficients in a zigzag order. The zigzag output is then compressed using runlength encoding. The entropy coder 214, in one example embodiment, may be configured to generate uniquely decodable (UD) codes (e.g. entropy codes). A code is said to be uniquely decodable if the original symbols can be recovered uniquely from sequences of encoded symbols. The output module 216 may be configured to generate a compressed version of the input digital image utilizing the generated UD codes.

The entropy coder 214, in one example embodiment, uses probability tables to generate entropy codes. In one embodiment, the probability tables may be Huffman tables and the entropy codes may be Huffman codes. A probability tables generator 212 may be configured to generate two sets of probability tables for an image, one for the luminance or grayscale components and one for the chrominance or color components.

In one example embodiment, the entropy coder 214 may be configured to examine each DCT coefficient associated with an input image or sub-image to determine whether a DCT coefficient is zero. The examination of coefficients may stop at the last non-zero entry rather than spanning the entire set of the DCT coefficients. The process of entropy coding may stop after signaling the final zero-run (if any).

The probability tables generator 212, in one example embodiment, may generate probability tables utilizing statistics associated with the input image provided by a statistics generator 400. In one example embodiment, the encoder 200 may be configured such that at least some of the DCT coefficients statistics collected by the statistics generator 400 may be saved for later use by the entropy coder 214. The encoder 200 may utilize a placement module 210 to store the DCT coefficients statistics in the available bits of the associated DCT coefficients. The example operations performed by the encoder 200 may be described with reference to FIG. 3.

Figure 3:
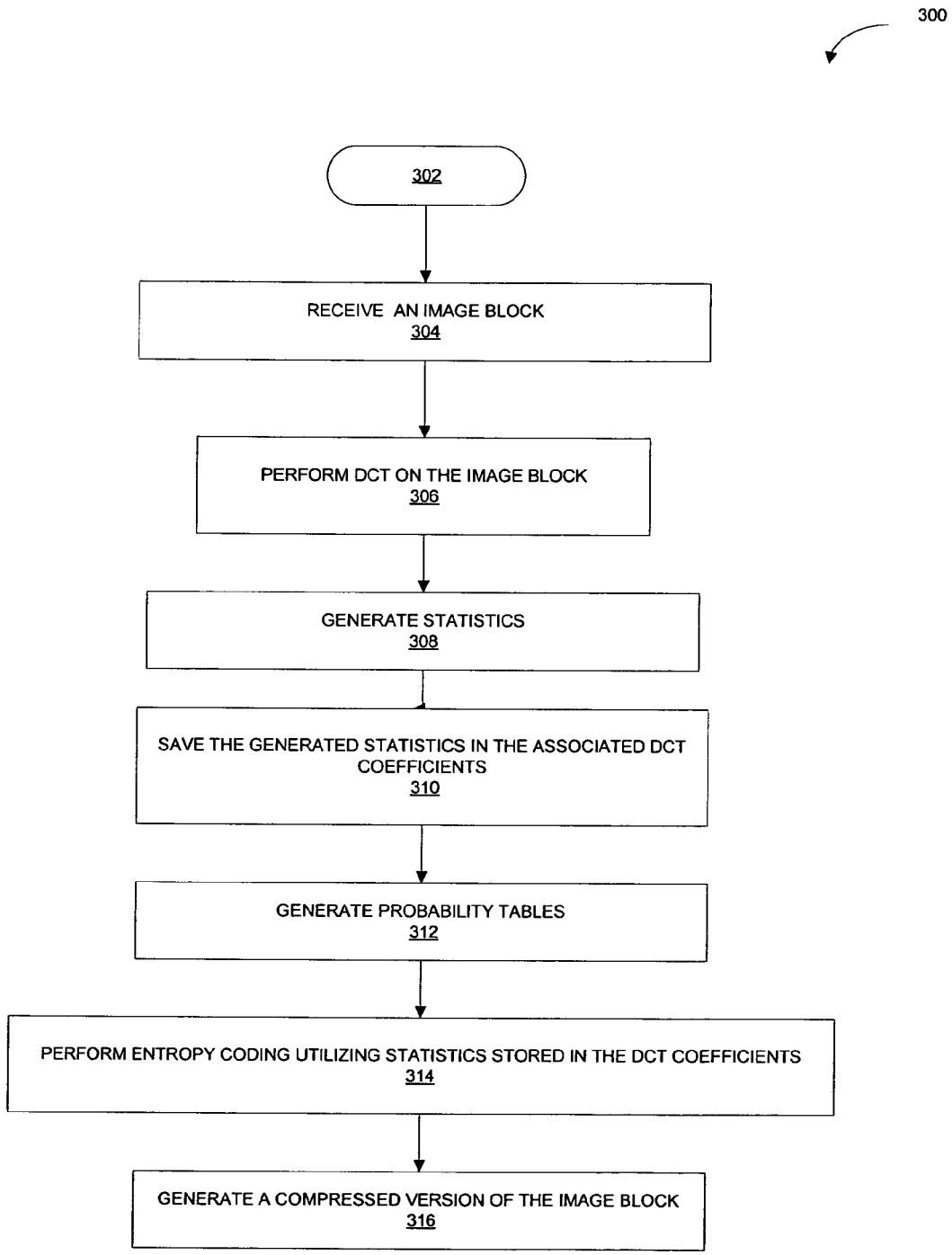
FIG. 3 is a flow chart illustrating a method, in accordance with an example embodiment, to generate a compressed image.

FIG. 3 is a flow chart illustrating a method 300, in accordance with an example embodiment, to generate a compressed image. The method 300 may be performed by processing logic that may comprise hardware (e.g., dedicated logic, programmable logic, microcode, etc.), software (such as run on a general purpose computer system or a dedicated machine), or a combination of both. It will be noted, that, in an example embodiment, the processing logic may reside in any of the modules shown in FIG. 3 described above.

As shown in FIG. 3, the method 300 commences at operation 302. At operation 304, DCT module 206 receives an image block. The DCT module 206 performs a Discrete Cosine Transform (DCT) on the image block at operation 306 to obtain DCT coefficients associated with the image block. At operation 308, the statistics generator 400 may generate statistics associated with the DCT coefficients. As the statistics generator 400 obtains a particular statistics value associated with a DCT coefficient, the placement module 210 may store the particular statistics value in the available bits of the DCT coefficient at operation 310.

At operation 312, the probability tables generator 212 utilizes the statistics generated at operation 308 to generate probability tables (operation 312). The entropy coder 214 then access and utilizes the statistics stored at operation 310 in DCT coefficients themselves to perform entropy coding, thereby avoiding at least some of the repeated computations. The entropy coding is performed at operation 314 to generate uniquely decodable (UD) codes (e.g., Huffman codes) for the DCT coefficients, utilizing the statistics stored in the DCT coefficients. At operation 316, a compressed version of the input block is generated utilizing the UD codes. An example statistics generator may be described with reference to FIG. 4.

Figure 4:
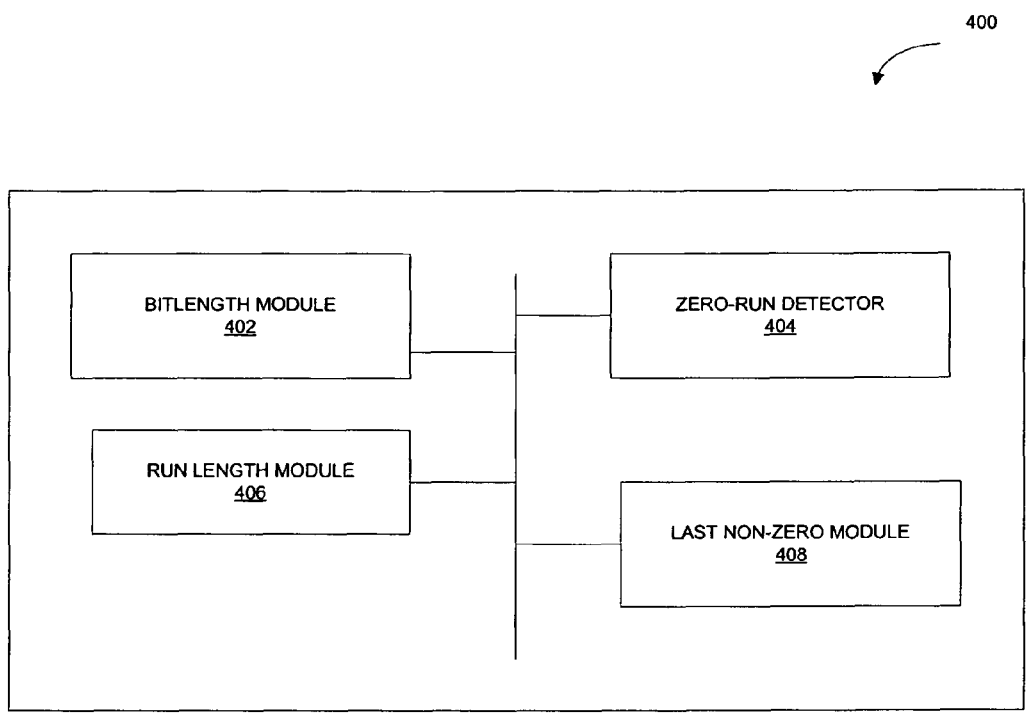
FIG. 4 is a block diagram illustrating a statistics generator, in accordance with an example embodiment.

FIG. 4 is a block diagram illustrating some modules of an example statistics generator 400, in accordance with an example embodiment. The statistics generator 400 may comprise a bit-length module 402, a zero-run detector 404 and a runlength module 406.

In one example embodiment, the bit depth of an image to be encoded may be 8 bits, in which case the maximum bit-length of any coefficient after a DCT equals 12. Because, in one example embodiment, the DCT coefficients may be represented in 16 bit quantities, there may be four additional bits available for storing data per a DCT coefficient. This additional space may be utilized to store the bit-length of the DCT coefficients. The bit-length module 402 may be configured to calculate the bit-length for a non-zero DCT coefficient and to provide the calculated bit-length to the placement module 210 of FIG. 2. The placement module 210 may then store the bit-length in the first four bits of the associated DCT coefficient.

Furthermore, in one example embodiment, the information pertaining to the runlengths of zero coefficients may be stored in some of the coefficients that are zero. The zero-run detector 404 may be configured to detect any zero-run that may be present in the set of DCT coefficients associated with the 8×8 block of the input image or sub-image. The runlength module 406 may be configured to calculate the runlength of the detected zero-run. In one example embodiment, the placement module 210 may be configured to store the calculated runlength of the zero-run in the first zero coefficient of the run.

In one example embodiment, the statistics generator 400 may further comprise a last non-zero module 408 to determine whether the last DCT coefficient of the input 8×8 block is zero. If the last DCT coefficient from the plurality of DCT coefficients associated with the input 8×8 block is zero, the placement module 210 may store the position of the last non-zero coefficient for future use, e.g., in the last coefficient of the 8×8 block (the 64th coefficient). The operations performed by the statistics generator 400 in cooperation with the placement module 210 may be described with reference to FIG. 5.

Figure 5:
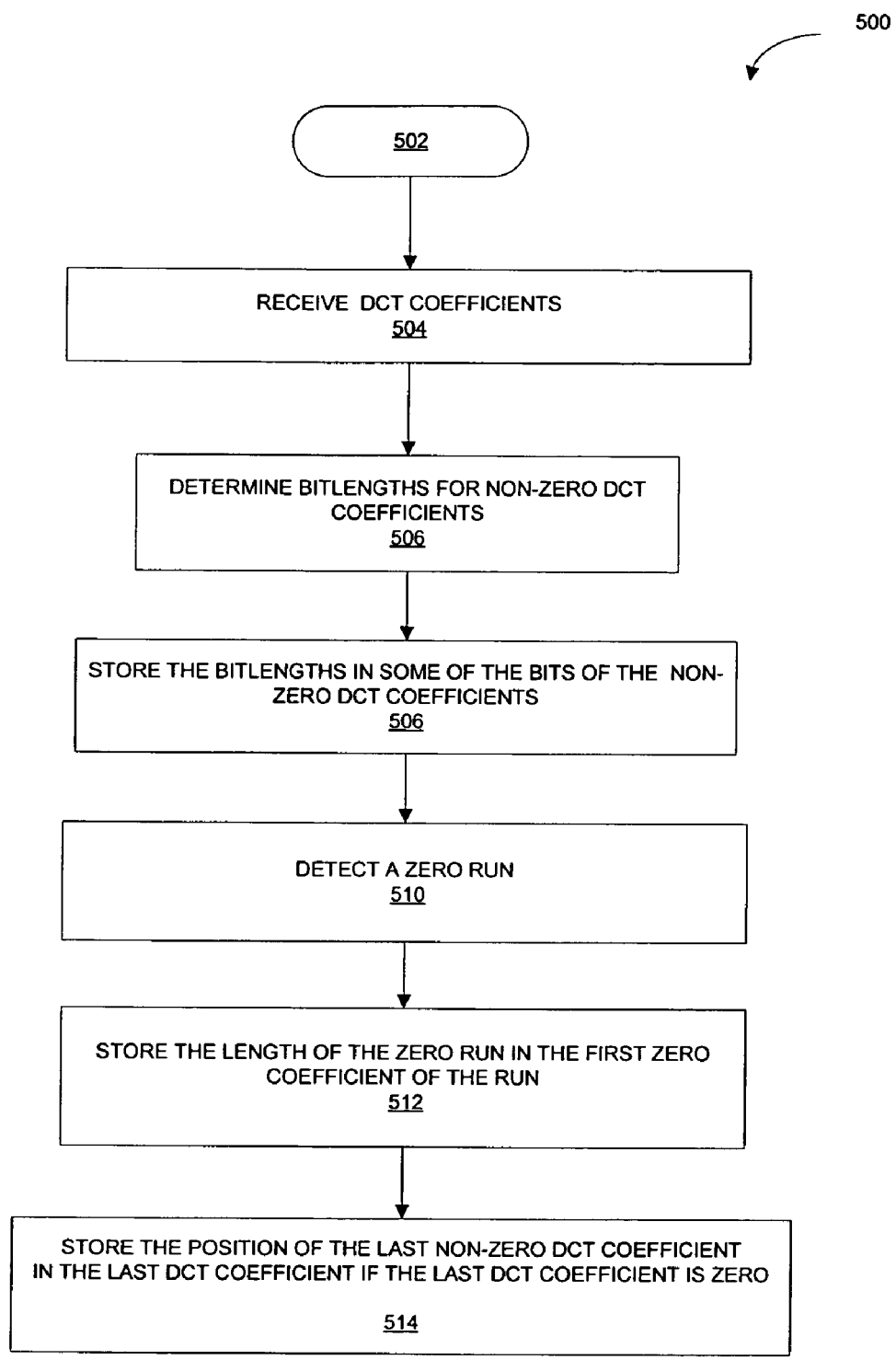
FIG. 5 is a flow chart illustrating a method to generate and store statistics, in accordance with an example embodiment.

FIG. 5 is a flow chart illustrating a method 500, in accordance with an example embodiment, to generate and store statistics associated with a plurality of DCT coefficients. The method 500 may be performed by processing logic that may comprise hardware (e.g., dedicated logic, programmable logic, microcode, etc.), software (such as run on a general purpose computer system or a dedicated machine), or a combination of both. It will be noted, that, in an example embodiment, the processing logic may reside in any of the modules shown in FIG. 2 and FIG. 4 described above.

Figure 6:
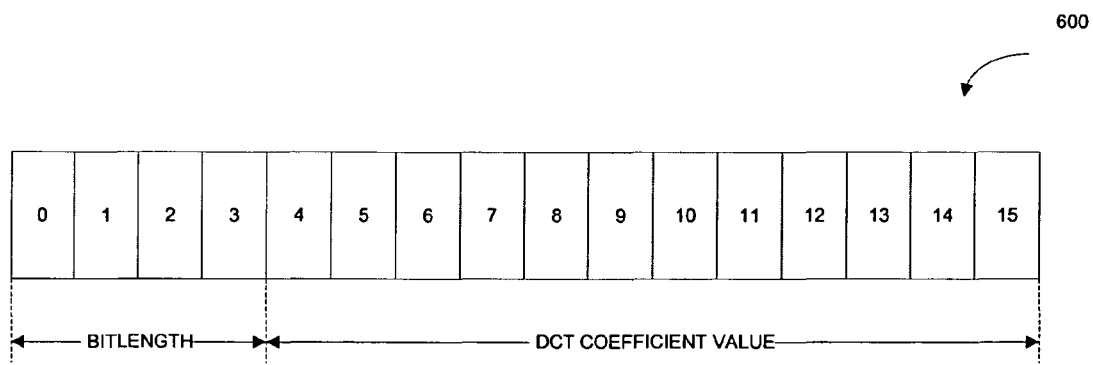
FIG. 6 illustrates a diagrammatic representation of a DCT coefficient storage, in accordance with an example embodiment.

As shown in FIG. 5, the method 500 commences at operation 502. At operation 504, the statistics generator 400 receives DCT coefficients associated with the 8×8 blocks of the image or sub-image. The bit-length module 402 may calculate the bit-lengths for non-zero DCT coefficients at operation 506 and provides the calculated bit-lengths to the placement module 210 of FIG. 2. The placement module 210 may store the bit-lengths in some of the available bits of the associated DCT coefficients at operation 506, as shown in FIG. 6.

Figure a 6 is a diagrammatic representation of a DCT coefficient storage 600. In one example embodiment, bits 0 through 3 of the DCT coefficient storage 600 may be used to store the bit-length of a non-zero DCT coefficient. Bits 4 through 15 of the DCT coefficient storage 600 may be used to store the value of a non-zero DCT coefficient. It will be noted that, in some embodiments, the bit-length may be stored in the last four bits of a DCT coefficient storage, or in the middle bits of a DCT coefficient storage. Furthermore, the bit-length does not need to be stored in consecutive bits of a DCT coefficient storage. For example, the bit-length may be "broken up" and stored, according to a rule, in the various locations of a DCT coefficient storage.

Returning to FIG. 5, at operation 510, the zero-run detector 404 may detect a zero-run present in the DCT coefficients and obtain the runlength of the detected zero-run. The placement module 210 may store the runlength of the zero-run in the first zero coefficient of the run, at operation 512. If the last DCT coefficient from the received DCT coefficients is zero, the placement module 210 may store the position of the last non-zero coefficient in the first zero coefficient of the associated zero-run, at operation 514.

It will be noted that, although the operations of the method 500 are shown as sequential, it will be understood that the order of operations may be changed in some example embodiments. For example, an operation to detect a zero-run may precede an operation to calculate the bit-length of a non-zero DCT coefficient.

In some embodiments, the method and system described above may result in reducing the amount of redundant computation because some of the statistics information that may be used in the process of entropy coding may made available from the DCT coefficients themselves. Furthermore, in one example embodiment, the zero coefficients may be skipped over during the entropy coding process, because the stored runlength value may provide information regarding how many subsequent DCT coefficients are zero.

The following pseudo-code describes the high level process to improve the optimization of entropy coding, according to one example embodiment. Pass 1 refers to operations performed to generate statistics for DCT coefficients associated with an input digital image and to store the generated statistics in the available bits of the DCT coefficients. Pass 2 refers to operations performed to entropy code the DCT coefficient utilizing the stored statistics information.

PASS 1:
For each block in image/sub-image
{
Perform DCT
// Let us assume that c[i] holds the ith DCT coefficient of the block. Each
// c[i] is a 16 bit entity.
For (i=1; i<63; i++)
{
if(c[i]=0
{
RunlengthOfZero++;
}
else
{
// The runlength of zero information is being stored in the first zero
// coefficient of the current zero run.
c[i - RunlengthOfZero]=RunlengthOfZero;
Update RunLenthOfZero statistics
b=bit-length(c[i])
Update the bit-length statistics
// The bit-length information is stored in the first 4 bits of the coefficient
c[i] I=b<<12
RunLengthOfZero=0
}
}
// Store the last run if any
if(RunLengthOfZero !=0)
c[i - RunLengthOfZero]=RunLengthOfZero
// The position of the last non-zero coefficient is stored in case the last
// coefficient c[63] is zero.
if(c[63]=0)
c[63]=63- RunLengthOfZero}
}
Generate the Huffman tables using the statistics just gathered.
PASS 2:
For each block in image/sub-image
{
//Find the position of the last non-zero element. If the size of c[63] is zero,
// then it was originally zero.
if((c[63]>>12)=0)
lastNonZero=c[63]
else
lastNonZero=63
For (i=1; i<lastNonZero; i++)
{
// Check if the size of a coefficient is zero since we have modified some zero
// value coefficients
if((c[i]>>12)=0)
{
RunlengthOfZero=c[i]
// move the index to the next non-zero coefficient
i+=RunlengthOfZero}
}
Write the Huffman code for the RunLengthOfZero
// Read the bit-length from the coefficient c[i] itself
b=c[i]>>12
Write the Huffman code for b
// The value of the coefficient is held in the last 12 bits
c=c[i] & 0x0FFF
Write the actual value of the coefficient c
RunLengthOfZero=0
}
Write the last zeroRun code if any
}

It will be noted that, in one example embodiment, the techniques described herein may be utilized in a variety of applications, including desk top applications for image processing, built-in logic for digital cameras, etc. It will be noted that, although the system and method for entropy coding have been described in the context of JPEG compression, the system and method may be utilized advantageously with image compression techniques that perform run length coding of zeros and that does performs two similar passes over an image—first to gather the run length statistics and second to actually use the statistics to generate entropy codes.

In one example embodiment, the method and system described herein may be utilized with a coding scheme that operates using the following steps:
1) dividing an image into blocks (the blocks may be any size, not necessarily 8×8 blocks as in JPEG);
2) optionally applying a transform (the transform is not necessarily DCT, it could be, e.g., wavelet, Hadamard, some approximation of DCT, or an identity transform, where no transform is applied); and
3) using an entropy coding method that relies on the statistics of the image being coded, which is generated in a separate pass from the coding pass.

Figure 7:
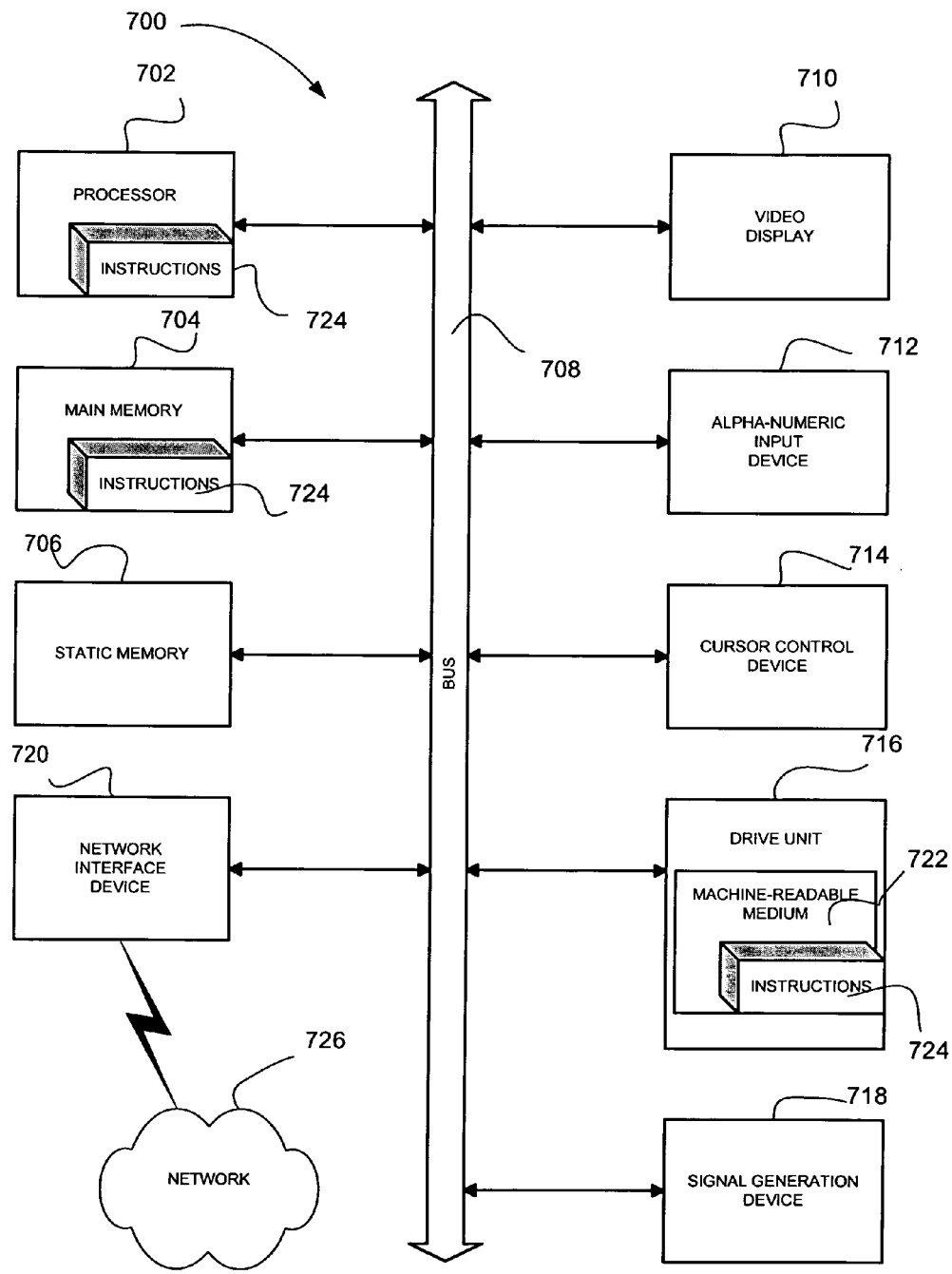
FIG. 7 illustrates a diagrammatic representation of a machine in the example form of a computer system within which a set of instructions, for causing the machine to perform any one or more of the methodologies discussed herein, may be executed.

FIG. 7 shows a diagrammatic representation of a machine in the example electronic form of a computer system 700 within which a set of instructions, for causing the machine to perform any one or more of the methodologies discussed herein, may be executed. In various embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a portable music player (e.g., a portable hard drive audio device such as an "Moving Picture Experts Group (MPEG) Layer 3" (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 700 includes a processor 702 (e.g., a central processing unit (CPU), a graphics processing unit (GPU) or both), a main memory 704 and a static memory 706, which communicate with each other via a bus 708. The computer system 700 may further include a video display unit 710 (e.g., a liquid crystal display (LCD) or a cathode ray tube (CRT)). The computer system 700 also includes an alphanumeric input device 712 (e.g., a keyboard), a user interface (UI) navigation device 714 (e.g., a mouse), a disk drive unit 716, a signal generation device 718 (e.g., a speaker) and a network interface device 720.

The disk drive unit 716 includes a machine-readable medium 722 on which is stored one or more sets of instructions and data structures (e.g., software 724) embodying or utilized by any one or more of the methodologies or functions described herein. The software 724 may also reside, completely or at least partially, within the main memory 704 and/or within the processor 702 during execution thereof by the computer system 700, the main memory 704 and the processor 702 also constituting machine-readable media.

The software 724 may further be transmitted or received over a network 726 via the network interface device 720 utilizing any one of a number of well-known transfer protocols (e.g., Hyper Text Transfer Protocol (HTTP)).

While the machine-readable medium 722 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention, or that is capable of storing, encoding or carrying data structures utilized by or associated with such a set of instructions. The term "machine-readable medium" shall accordingly be taken to include, but not be limited to, solid-state memories, optical and magnetic media, and carrier wave signals. Such medium may also include, without limitation, hard disks, floppy disks, flash memory cards, digital video disks, random access memory (RAMs), read only memory (ROMs), and the like.

The embodiments described herein may be implemented in an operating environment comprising software installed on a computer, in hardware, or in a combination of software and hardware.

Thus, a method and system for generating a compressed image have been described. Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:

1. A system comprising:
an input module to receive a digital image;
a Discrete Cosine Transform (DCT) module to obtain a plurality of DCT coefficients associated with the digital image, each DCT coefficient from the plurality of DCT coefficients associated with a DCT coefficient storage comprising one or more bits for storing a value of a DCT coefficient and one or more available bits;
a statistics generator to generate statistics associated with the plurality of DCT coefficients, the statistics comprising a first value and a second value, the first value comprising a bit-length of a non-zero DCT coefficient, the second value comprising a length of a zero-run;
a placement module to store the generated statistics in at least some of the available bits of the plurality of DCT coefficients, the placement module to store the first value in at least some of available bits of a non-zero DCT coefficient from the plurality of DCT coefficients and to store the second value in at least some of available bits of a zero-value DCT coefficient from the plurality of DCT coefficients; and
an entropy coder to generate uniquely decodable (UD) codes for the plurality of DCT coefficients utilizing the statistics stored in the plurality of DCT coefficients.

2. The system of claim 1, wherein:
the statistics generator comprises a bit-length module to determine a bit-length of a DCT coefficient from the plurality of DCT coefficients;
the placement module is to store the bit-length of the DCT coefficient in a first portion of a non-zero coefficient storage, the non-zero coefficient storage storing a value of the DCT coefficient in a second portion of the non-zero coefficient storage; and
the entropy coder is to generate the UD codes utilizing the bit-length stored in the coefficient storage.

3. The system of claim 1, further comprising:
a zero-run detector to detect a zero-run in the plurality of DCT coefficients; and
a runlength module to determine a runlength of the zero-run, the placement module being to store the runlength of the zero-run in a zero coefficient storage, the zero coefficient storage being associated with a first zero coefficient from the zero-run.

4. The system of claim 1, further comprising a last non-zero module to:
   determine that a value of a last DCT coefficient from the plurality of DCT coefficients is zero, the last DCT coefficient being a last-accessed DCT coefficient when all other DCT coefficients in the plurality of the DCT coefficients have already been accessed; and
   determine a position of a last non-zero DCT coefficient from the plurality of DCT coefficients, the last non-zero DCT coefficient being the most recently accessed non-zero DCT coefficient after all other non-zero DCT coefficients in the plurality of the DCT coefficients have already been accessed,
   the placement module being to store the position of the last non-zero DCT coefficient in available bits of the last DCT coefficient.

5. The system of claim 4, wherein the entropy coder is to generate the UD codes utilizing the position of the last non-zero DCT coefficient stored in the last coefficient storage.

6. The system of claim 1, wherein the image is a raw digital image.

7. The system of claim 1, wherein the image is a compressed image.

8. The system of claim 1, wherein the entropy coder is to utilize Huffman encoding.

9. The system of claim 1, further comprising an output module to generate a compressed version of the digital image utilizing the UD codes.

10. The system of claim 9, further comprising a decoder to recreate the digital image utilizing the compressed version of the digital image.

11. A method comprising:
   receiving a digital image;
   obtaining a plurality of Discrete Cosine Transform (DCT) coefficients associated with the digital image, each DCT coefficient from the plurality of DCT coefficients comprising one or more bits for storing a value of a DCT coefficient and one or more available bits;
   generating statistics associated with the plurality of DCT coefficients, the statistics comprising a first value and a second value, the first value comprising a bit-length of a non-zero DCT coefficient, the second value comprising a length of a zero-run;
   storing the generated statistics in at least some of the available bits of the plurality of DCT coefficients, the storing comprising:
      for each DCT coefficient from the non-zero DCT coefficients storing the first value in the one or more available bits of the non-zero DCT coefficient, and
      storing the second value in at least some of available bits of a zero-value DCT coefficient from the plurality of DCT coefficients; and
   generating uniquely decodable (UD) codes for the plurality of DCT coefficients utilizing the statistics stored in the plurality of DCT coefficients.

12. The method of claim 11, wherein:
   the generating of the statistics associated with the plurality of DCT coefficients comprises determining a bit-length of a DCT coefficient from the plurality of DCT coefficients; and
   the storing of the generated statistics in the plurality of DCT coefficients comprises storing the bit-length of the DCT coefficient in a first portion of a non-zero coefficient storage, the non-zero coefficient storage storing a value of the DCT coefficient in a second portion of the non-zero coefficient storage.

13. The method of claim 11, wherein:
   the generating of the statistics associated with the plurality of DCT coefficients comprises:
      detecting a zero-run in the plurality of DCT coefficients, the zero-run comprising a sequence of DCT coefficients of zero value, and
      determining a runlength of the zero-run; and
   the storing of the runlength of the zero-run in a zero coefficient storage, the zero coefficient storage being associated with a first zero coefficient from the zero-run.

14. The method of claim 11, wherein:
   the generating of the statistics associated with the plurality of DCT coefficients comprises:
   determining that a value of a last position DCT coefficient from the plurality of DCT coefficients is zero, the last DCT coefficient being a last-accessed DCT coefficient when all other DCT coefficients in the plurality of the DCT coefficients have already been accessed, and
   determining a position of a last non-zero DCT coefficient from the plurality of DCT coefficients, the last DCT non-zero coefficient being a last-accessed non-zero DCT coefficient when all other non-zero DCT coefficients in the plurality of the DCT coefficients have already been accessed; and
   the storing of the generated statistics in the plurality of DCT coefficients comprises storing the position of the last non-zero DCT coefficient in at least some of available bits of the last position DCT coefficient.

15. The method of claim 14, wherein the generating of the uniquely decodable (UD) codes for the plurality of DCT coefficients utilizing the statistics stored in the plurality of DCT coefficients comprises utilizing the last non-zero DCT coefficient stored in the at least some of available bits of the last position DCT coefficient.

16. The method of claim 11, wherein the digital image is a raw digital image.

17. The method of claim 11, wherein the image is a compressed digital image.

18. The method of claim 11, wherein the generating of the UD codes comprises utilizing Huffman encoding.

19. The system of claim 11, further comprising generating a compressed version of the digital image utilizing the UD codes.

20. A system comprising:
   an input module to receive an image;
   a Discrete Cosine Transform (DCT) module to obtain a plurality of DCT coefficients associated with the image;
   a statistics generator to generate statistics associated with the plurality of DCT coefficients;
   an entropy coder to generate uniquely decodable (UD) codes for the plurality of DCT coefficients utilizing the statistics stored in the plurality of DCT coefficients;
   a last non-zero module to:
      determine that a value of a last position DCT coefficient from the plurality of DCT coefficients is zero, the last position DCT coefficient being a last-accessed DCT coefficient when all other DCT coefficients in the plurality of the DCT coefficients have already been accessed, and
      determine a position of a last non-zero DCT coefficient from the plurality of DCT coefficients, the last non-zero DCT coefficient being the most recently accessed non-zero DCT coefficient after all other non-zero DCT coefficients in the plurality of the DCT coefficients have already been accessed;

the placement module to store the position of the last non-zero DCT coefficient in at least some of available bits of the last position DCT coefficient; and an entropy coder to encode the plurality of DCT coefficients utilizing the position of the last non-zero DCT coefficient stored in the at least some of available bits of the last position DCT coefficient.

21. The system of claim 20, further comprising an output module to generate a compressed version of the image utilizing the UD codes.

22. A non-transitory computer readable medium having instruction data to cause a machine to:

receive a digital image;

obtain a plurality of Discrete Cosine Transform (DCT) coefficients associated with the digital image, each DCT coefficient from the plurality of DCT coefficients associated with a DCT coefficient storage comprising one or more bits for storing a value of a DCT coefficient and one or more available bits;

generate statistics associated with the plurality of DCT coefficients, the statistics comprising a first value and a second value, the first value comprising a bit-length of a non-zero DCT coefficient, the second value comprising a length of a zero-run;

store the generated statistics in at least some of the available bits of the plurality of DCT coefficients, the placement module to store the first value in at least some of available bits of a non-zero DCT coefficient from the plurality of DCT coefficients and to store the second value in at least some of available bits of a zero-value DCT coefficient from the plurality of DCT coefficients;

generate uniquely decodable (UD) codes for the plurality of DCT coefficients utilizing the statistics stored in the plurality of DCT coefficients; and generate a compressed version of the digital image utilizing the UD codes.

\* \* \* \* \*